United States Patent [19]
Kato et al.

[11] Patent Number: 4,939,568
[45] Date of Patent: Jul. 3, 1990

[54] THREE-DIMENSIONAL INTEGRATED CIRCUIT AND MANUFACTURING METHOD THEREOF

[75] Inventors: Takashi Kato; Masao Taguchi, both of Sagamihara, Japan

[73] Assignee: Fujitsu Limited, Kawasaki, Japan

[21] Appl. No.: 325,122

[22] Filed: Mar. 17, 1989

Related U.S. Application Data

[63] Continuation of Ser. No. 27,199, Mar. 17, 1987, abandoned.

[30] Foreign Application Priority Data

Mar. 20, 1986 [JP] Japan ................................. 61-62981
May 20, 1986 [JP] Japan ................................ 61-116470

[51] Int. Cl.⁵ ...................... H01L 23/12; H01L 23/52; H01L 27/10
[52] U.S. Cl. ......................................... 357/75; 357/49; 357/68
[58] Field of Search ....................... 357/49, 71, 43, 41, 357/68, 75, 59, 54

[56] References Cited

U.S. PATENT DOCUMENTS

| | | | |
|---|---|---|---|
| 3,787,252 | 0/0000 | . | |
| 4,074,342 | 2/1978 | Honn et al. | 357/71 |
| 4,500,905 | 2/1985 | Shibata | 357/41 |
| 4,523,211 | 6/1985 | Morimoto et al. | 357/49 |
| 4,688,069 | 8/1987 | Joy et al. | 357/43 |
| 4,761,681 | 8/1988 | Reid | 357/68 |
| 4,807,021 | 2/1989 | Okumura | 357/68 |

FOREIGN PATENT DOCUMENTS

| | | | |
|---|---|---|---|
| 0076101 | 4/1983 | European Pat. Off. . | |
| 3233195 | 3/1983 | Fed. Rep. of Germany . | |
| 2295570 | 7/1976 | France . | |
| 0092254 | 6/1983 | Japan | 357/43 |
| 61-29153 | 7/1984 | Japan . | |

OTHER PUBLICATIONS

"Active Silicon Chip Carrier"-Bodendorff et al.-IBM Technical Disclosure Bulletin-vol. 15, No. 2, Jul. 1972, pp. 656-657.
"Decoupling Capacitor Document"-Parisi-IBM Technical Disclosure Bulletin-vol. 19, No. 8, Jan. 1977, pp. 3046-3047.
IEDM 84, "Promising New Fabrication Process Developed for Stacked LSI's", by M. Yasumoto et al., pp. 816-819.
Patent Abstracts of Japan, vol. 10, No. 179, Jun. 24, 1986 & JP-A-61-29 153.
Patent Abstracts of Japan, vol. 7, No. 222, Oct. 4, 1983 & JP-A-58 112 348.
Computer, vol. 17, No. 1, Jan. 1984, "A Cellular VLSI Architecture", by J. Grinberg et al., pp. 69-81.

Primary Examiner—Rolf Hille
Assistant Examiner—S. V. Clark
Attorney, Agent, or Firm—Staas & Halsey

[57] ABSTRACT

The present invention is directed to a three-dimensional stacked IC and a method for forming a three-dimensional stacked IC on a base plate. The three-dimensional stacked IC includes a unit semiconductor IC, which has constituent ICs formed on either one surface or on both surfaces of a substrate. In addition, the unit semiconductor ICs have a plurality of conducting posts buried in and penetrating through the substrate and insulated therefrom. The unit semiconductor ICs have interconnection terminals provided on both sides of the substrate for connecting other unit semiconductor ICs or a base plate. By stacking plural unit ICs on the base plate, a very large scale IC can be fabricated. Each constituent IC is formed on a bulk silicon substrate, therefore excellent quality can be obtained. This can be also applied to the fabrication of a ROM structure such as a PROM or MASK ROM, using single unit semiconductor ICs, wherein a wiring for the ROM can be formed on the second surface of the substrate.

15 Claims, 19 Drawing Sheets

THREE-DIMENSIONAL INTEGRATED CIRCUIT AND MANUFACTURING METHOD THEREOF

This is a continuation of co-pending application Ser. No. 027,199 filed on Mar. 17, 1987.

BACKGROUND OF THE INVENTION

1. Field of the Invention

This invention relates to a three-dimensional semiconductor integrated circuit (IC) and a method for manufacturing the same. More particularly, the three-dimensional semiconductor IC of the present invention comprises a unit semiconductor IC, which has ICs formed on both surfaces of a substrate. The unit semiconductor IC has a plurality of conducting posts which are buried in and extend to both surfaces of the substrate. The conducting posts are insulated from the substrate. The unit semiconductor IC also has interconnection terminals for connecting other unit semiconductor ICs to both sides of the substrate. By stacking plural unit semiconductor ICs on a base plate, a very large scale IC can be manufactured. The structure of a single unit semiconductor IC according to the present invention can also be used for a PROM or MASK ROM structure.

2. Description of the Prior Art

Conventional ICs are formed on a surface of a silicon substrate. A high integration is achieved by enlarging a chip area employing a two-dimensional method which includes making each individual element small and each wiring fine. The above two dimensional method has limitations in wafer process technology. Accordingly, three-dimensional ICs have been proposed.

The technology under development regarding three-dimensional ICs is mainly concentrated on SOI (silicon on insulator) technology. As an example of SOI technology, an insulating film is grown on a main substrate by a CVD (chemical vapor deposition) or a thermal oxidation method, and then a polysilicon layer is deposited thereon by CVD. The polysilicon layer is laser-annealed resulting in a recrystallization thereof and single crystal regions are partly formed. Upper semiconductor elements are then formed on the single crystal regions.

This method, however, has a problem in that a silicon crystal of high quality having very few grain boundaries cannot be grown with a good reproducibility. Consequently, the production process of a three-dimensional IC having a multilayer SOI structure has a very low yield rate.

Another prior art method for making a three-dimensional IC has been disclosed in "Promising New Fabrication Process Developed for Stacked LSIs", M. Yasumoto et al., IEDM, 1984, pps. 816–819 and is shown in FIG. 1.

Figure 1:
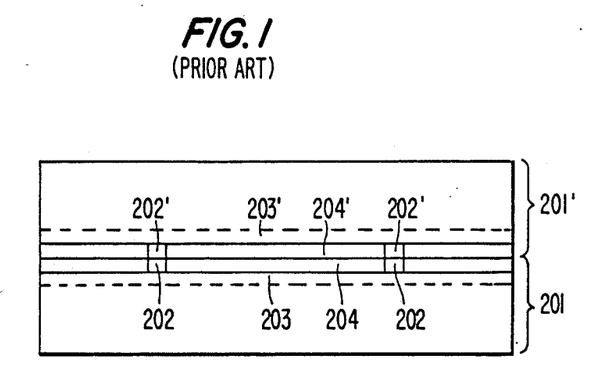
FIG. 1 is a cross-sectional view of a prior art two-stage stacked three-dimensional IC.

In FIG. 1, two separate IC chips 201 and 201' are provided, each having contact pads or terminals 202 or 202' formed on a first surface of a substrate on which each IC (201, 201') is formed. Two chips are assembled as a single stacked three-dimensional IC by turning over IC chip 201' and stacking it on IC chip 201. These two ICs are adhered to each other using the contact pads or terminals (202, 202'). In FIG. 1, regions 203 and 203' are constituent ICs for each IC chip. The two IC chips are bonded together with the aid of insulating and adhesive layers 204 and 204'. This method is applicable only when two IC chips are stacked together.

SUMMARY OF THE INVENTION

It is an object of the present invention to achieve a higher integration rate utilizing a stacked construction of unit semiconductor ICs.

It is a further object of the present invention to obtain good quality, high reliability and good production yield of ICs.

It is still another object of the present invention to apply the present technology to fabricate a ROM, such as a PROM and MASK ROM, simplify production steps and reduce the manufacturing time for the MASK ROM after receiving logic information therefor.

These objects are achieved by utilizing a unit semiconductor IC, wherein a constituent IC (e.g., a circuit including a functional element of either an active element such as a transistor, diode, etc., or a passive element such as a resistor or capacitor) is formed on a first surface or on both first and second surfaces of a silicon substrate, and electrical conducting posts are formed, penetrating but insulated from the substrate, and connecting specified points of both surfaces. Interconnection terminals are formed on both sides of the substrate on a surface of a cover insulating layer formed on the constituent IC except when the unit semiconductor IC is used in a top position of stacked three-dimensional IC.

Figure 2A:
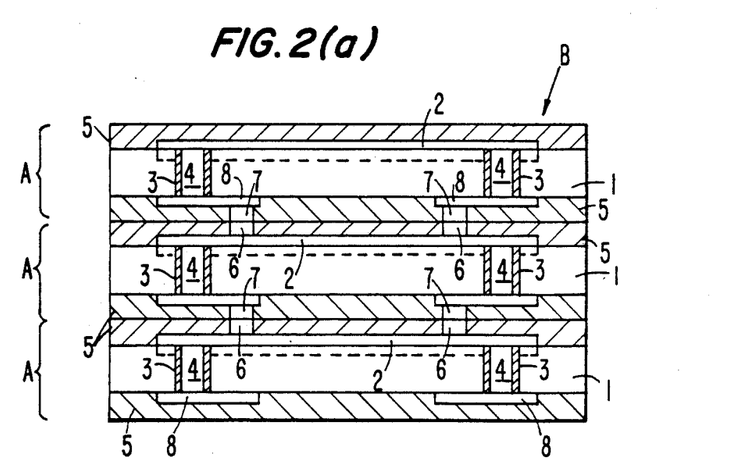
FIG. 2(a) is a cross-sectional view of a three-stage stacked three-dimensional IC according to the present invention in which ICs are formed on a first surface of a substrate.
Figure 2B:
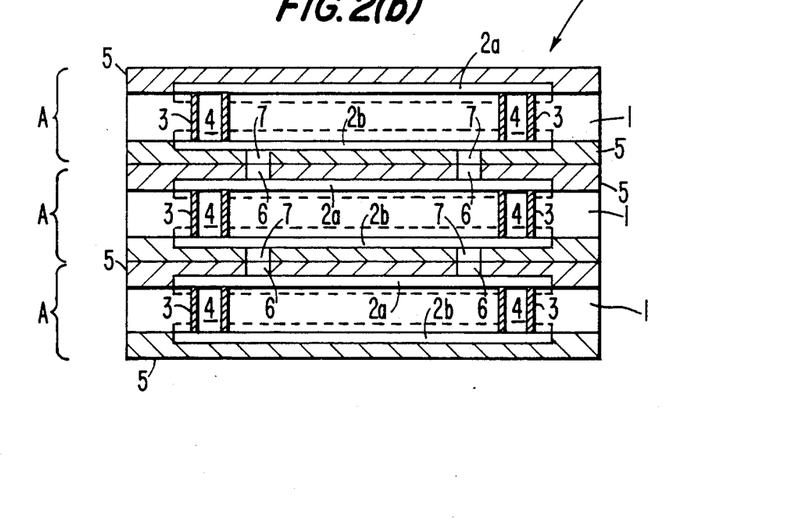
FIG. 2(b) is a cross-sectional view of a three-stage stacked three-dimensional IC according to the present invention in which constituent ICs are formed on both surfaces of a substrate.

A cross-sectional view of a three-dimensional IC of the present invention is shown in FIGS. 2(a) and 2(b). A plurality of unit semiconductor ICs A (hereinafter referred to as unit ICs) are used. The unit ICs are stacked and form a completed three-dimensional IC B having a three-stage stacked construction and having a large scale integration.

In FIG. 2(a), each constituent IC 2 is formed on a first surface of a substrate 1 of a unit IC A, and in FIG. 2(b), two constituent ICs 2a and 2b are formed on both surfaces of each substrate 1. Conducting posts 4 are provided, penetrating and insulated from the substrate by an insulating film 3. The conducting posts 4 are connected to wirings formed in a constituent IC (2, 2(a), 2(b)), however they are connected to a wiring 8 formed on the second surface of the substrate 1 in FIG. 2(a). Each constituent IC has interconnection terminals 6 or 7, except for a unit IC at the top or bottom position of the stacked three-dimensional IC B. Each unit IC is covered with insulating layers 5, which also function, along with the interconnection terminals 6 and 7, to connect two unit ICs.

Each constituent IC (2, 2(a), 2(b)) is formed on a silicon substrate having a single bulk crystal structure. Therefore, characteristics thereof are easy to control and a simple test can be employed for screening the unit IC. This results in a good yield of stacked three-dimensional ICs.

The unit IC concept of the present invention is easily applied to PROM or MASK ROM fabrication, using single unit ICs. As for a MASK ROM, word lines and other active elements, such as transistors, are formed on a first surface of the substrate and bit lines are separately formed on a second surface of the substrate. This MASK ROM structure is useful in modifying written logic information when a change in logic information is requested because the bit lines are formed on the second surface of the ROM structure and therefore, the logic is easy to change. As for a PROM, wirings to a power source are conventionally formed on the same surface of the substrate as memory elements. However, wirings can be formed on a second surface of the substrate to increase the integration density and reliability of the PROM.

These objects and advantages, together with other objects and advantages which will be subsequently apparent, reside in the details of construction, as more fully hereinafter described and claimed, reference being had to the accompanying drawings forming a part thereof.

DESCRIPTION OF THE PREFERRED EMBODIMENTS

Figure 3:
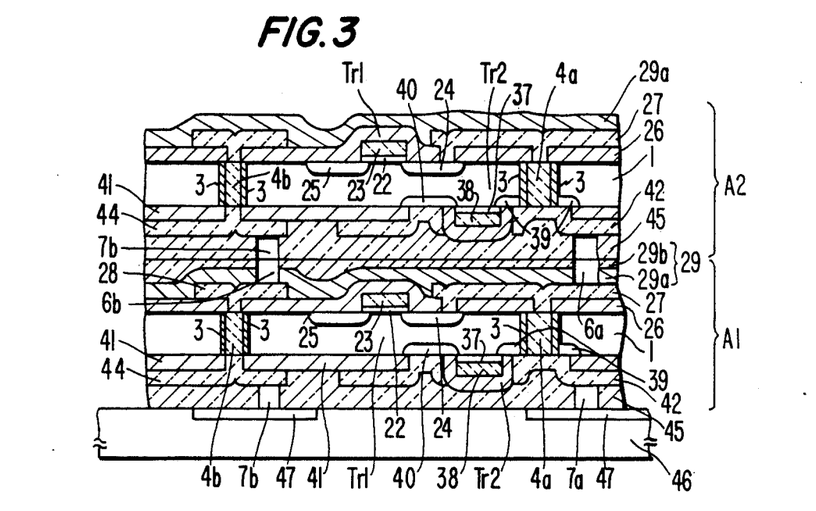
FIG. 3 is a cross-sectional view of an embodiment according to the present invention, wherein two unit ICs are stacked, each having a constituent IC formed on both surfaces of the substrate.

FIG. 3 is a cross-sectional view of a first embodiment according to the present invention. This figure corresponds to the cross-sectional view of FIG. 2(b), but has a two-stage stacked construction. A unit semiconductor integrated circuit (IC) $A_1$ is stacked on a base plate 46 made of, for example, ceramic, and another unit IC $A_2$ is thereafter stacked and fixed thereon. The forming processes of active elements and other elements on the second surface shown in FIG. 3, are omitted in FIG. 2(a).

The first unit IC $A_1$ comprises a first constituent IC including an n-channel MOS transistor $T_{r1}$ formed on the first surface of a p-type silicon substrate 1, and a second constituent IC including an n-channel MOS transistor $T_{r2}$ formed on the second surface of the substrate. Insulating layers 26 and 41 of silicon dioxide and wiring layers 27, 42 and 44 of n+-type polysilicon are formed on both surfaces of the substrate. Conducting posts 4a and 4b of n+-type polysilicon are formed penetrating the p-type silicon substrate 1 and insulated from the substrate 1 by an insulating film 3 of silicon dioxide (SiO$_2$). The conductive posts also connect the wiring layers 27 to 42, and 28 to 44.

First cover insulating layers 29 (29a, 29b) are formed on the wiring layers 27 and 28 and the insulating layers 26. A second cover insulating layer 45 is formed on the wiring layers 42 and 44 and the insulating layer 41. The first cover insulating layer 29 includes an inner insulating layer 29a of silicon oxide and an outer insulating layer 29b. The insulating layers 29b and 45 are formed of thermosetting silicon resin. Interconnection terminals 6 (6a, 6b) and 7 (7a, 7b), for which thermocompression bonding is applied, extend above the first and second cover insulating layers 29 and 45. The first unit IC $A_1$ is fixed to the base plate 46 using interconnection terminals 7 (7a, 7b) and a thermosetting silicon resin 45.

The second unit IC $A_2$ has almost the same construction as the first unit IC $A_1$ except that it has no interconnection terminals 6 (6a, 6b) and no outer insulating layer 29b because it is used at a top position of the stacked IC. The second unit IC $A_2$ is placed on the first unit IC $A_1$, aligning interconnection terminals 7 (7a, 7b) with the interconnecting terminals 6 (6a, 6b). The first and second unit ICs $A_1$ and $A_2$ are bonded together by thermocompression, and therefore, are electrically connected. The second cover insulating layer 45 and the outer insulating layer 29b of the unit ICs, are formed of thermosetting resin PMSS. The thermosetting resin PMSS becomes a fluid state when heated to a temperature between 350° and 400° C. and subsequently becomes a solid by thermal curing. Therefore, it is a suitable material to fix two unit ICs, and forms a substantially flat surface.

The detailed manufacturing process of the first embodiment shown in FIG. 3 will be explained. A cross-sectional view corresponding to each successive step in the manufacturing process for the device in FIG. 3 is shown in FIGS. 4(a) through 4(l), respectively. Same or like reference numerals designate same or corresponding parts throughout the drawings.

Before proceeding to form a conducting post, processes for forming a channel stopper and a field oxide layer are carried out for a first surface of the substrate 1 by a conventional method. However, to avoid complication, these processes are omitted in the following explanation.

Figure 4A:
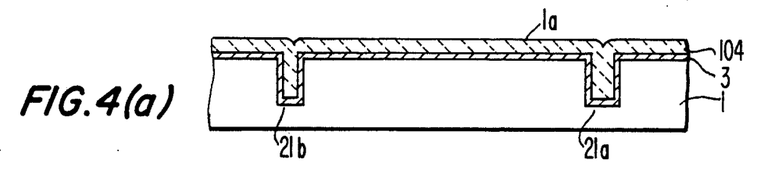
FIGS. 4(a) through 4(l) are cross-sectional views of successive steps during a manufacturing process of the stacked three-dimensional IC shown in FIG. 3.

In FIG. 4(a), a plurality of holes 21 (21a, 21b) being, for example, 2 to 4 μm in diameter and approximately 10 μm in depth, are formed in the first surface of the p-type silicon substrate 1 by an ion-milling or a reactive ion-etching (RIE) method. Next, an insulating film 3, such as a 5000 Å thick layer of silicon dioxide (SiO$_2$), is grown on the first surface of the substrate 1, including the inner walls of the holes 21 (21a, 21b), by a thermal oxidation or chemical vapor deposition (CVD) method. An n+-type polysilicon layer 104 is then grown on the entire first surface of the substrate and completely fills the holes 21 (21a, 21b).

Figure 4B:
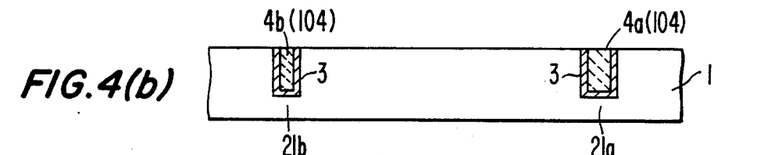

Next, the substrate surface is subject to an isotropic dry etching process, which etch backs and removes the polysilicon layer 104 above the substrate 1, as shown in FIG. 4(b). Further, the insulating film 3 of SiO$_2$ formed on the substrate 1 is removed by a conventional plasma etching or similar method, leaving conducting posts 4 (4a, 4b) of n+-type polysilicon which are insulated from the substrate 1 by the insulating film 3.

Figure 4C:
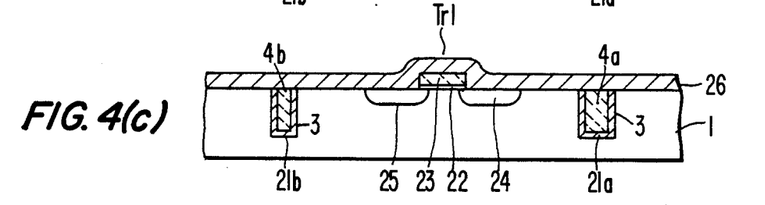

In FIG. 4(c), a gate oxide film 22 is grown and a polysilicon layer is deposited by a CVD method. A gate electrode 23 is formed by a RIE (reactive ion-etching)

method and thereafter an n+-type source region 24 and an n+-type drain region 25 are formed by a conventional MOS process. Finally, a MOS transistor $T_{r1}$ and other elements such as resistors and capacitors are also formed (not shown in the figure). An insulating layer 26 of $SiO_2$ having a thickness of 5000 Å is then deposited on the entire first surface of the substrate.

Figure 4D:
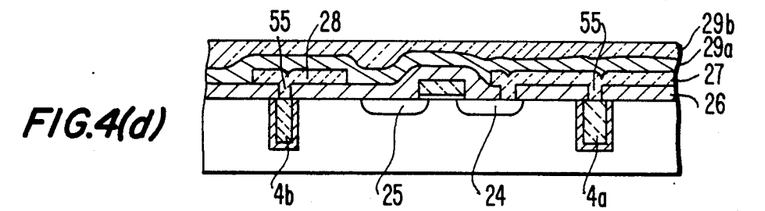

Next, contact windows 55 are formed in the insulating layer 26 and an n+-type polysilicon layer is deposited by a CVD method above the substrate, as shown in FIG. 4(d). The polysilicon layer is patterned by a conventional photolithography technique. Consequently, a source wiring 27, a drain wiring (not shown in the figure) and a wiring 28 are formed. In this process, the source wiring 27 and the wiring 28 contact the upper portions of the conducting posts 4 (4a, 4b), respectively, through contact windows 55 formed in the insulating layer 26.

An inner insulating layer 29a (a passivation layer such as silicon oxide, silicon nitride or phosphosilicate glass) is then formed by a CVD method to a thickness of 5000 Å, and then an outer insulating layer 29b (PMSS layer) is coated on the entire first surface of the substrate by a spin coating or a dip coating method. Insulating layers 29a and 29b form a first cover insulating layer 29.

PMSS is a type of thermosetting resin and is an abbreviated name for silylated polymethylsilsesquioxane. It is a suitable resin material for coating a surface requiring a heat-resisting property after curing. PMSS has a molecular weight of 30000 to 40000 and a curing temperature of 350° to 400° C. Because PMSS becomes a fluid state when heated to the curing temperature, a flat surface can be obtained. PMSS is disclosed in Japan Patent Tokukaisho 61-29153 by S. Fukuyama et al., Feb. 10, 1986.

Figure 4E:
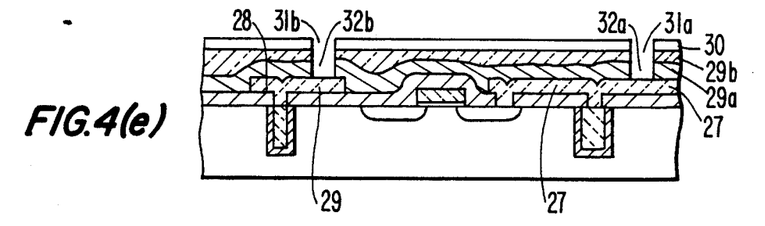

In FIG. 4(e), a spin coated substrate having a layer of PMSS thereon is heated in an atmosphere of 100° C., resulting in evaporation of the solvent involved in the outer insulating layer 29b of PMSS. Subsequently, the substrate is heated to 350° to 400° C. for curing the PMSS. A 2000 Å thick aluminum layer 30 is then deposited on the outer insulating layer 29b. Portions of the aluminum layer 30 corresponding to the holes 31 (31a, 31b) are removed by a conventional photolithography technique. The hole portions 31 are subject first to a dry etching process by an oxygen plasma, and next to a RIE process using, for example, $CHF_3$ gas, whereby the aluminum layer 30 functions as an etching mask. Holes 32 (32a, 32b) are formed in the first cover insulating layer 29 (29a, 29b). Surface portions of polysilicon wirings 27 and 28 are exposed.

Figure 4F:
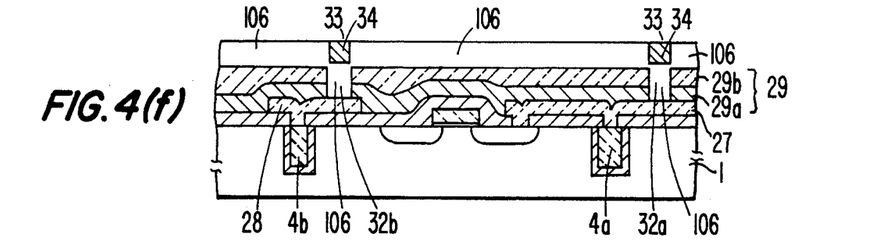

Next, a metal layer, such as an aluminum layer 106, is deposited on an entire surface of the device to a thickness a little greater than or approximately equal to the total thickness of the first cover insulating layer 29 (29a, 29b), as shown in FIG. 4(f). New holes 33 are formed in the aluminum layer 106 over the area corresponding to holes 32 (32a, 32b) previously formed in the first cover insulating layer 29. Thereafter, the holes 33 are filled with a resist material 34 by spin coating and the excess resist material is subsequently removed by an etching back process. Although aluminum alone may be applicable for thermocompression bonding, it is preferable to deposit a gold layer on the aluminum layer 106.

Figure 4G:
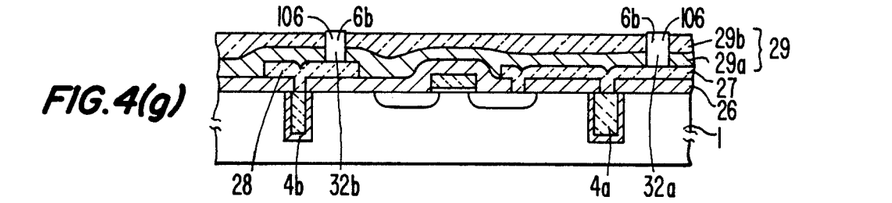

The aluminum layer 106 is then selectively removed using the resist material 34 in the holes 33 as a mask, and thereafter the remaining resist material 34 is removed. Consequently, interconnection terminals 6 (6a, 6b) of aluminum (preferably covered with gold) are formed buried in the first cover insulating layer 29 so as to contact the source wiring 27 and wiring 28, and are used for thermocompression bonding.

Figure 4H:
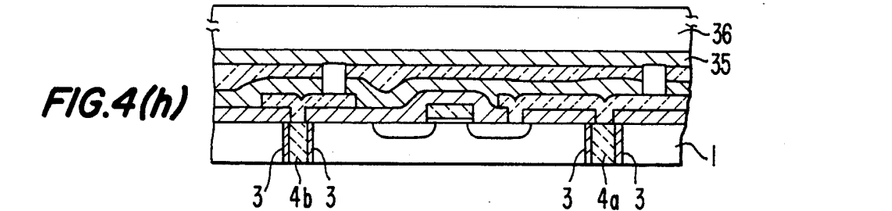

In FIG. 4(h), a support plate 36 of quartz or similar material is fixed to the first surface of the substrate using a thermoplastic resin layer 35 such as polyoxybenzylene. Polyoxybenzylene has a characteristic of softening above a temperature of approximately 450° C. The second (bottom) surface of the substrate is ground until the lower portions of the conducting posts 4 (4a, 4b) are exposed, and then etched chemically and mechanically until the surface is polished to a smooth mirror finish. Consequently, the silicon substrate 1 is reduced to approximately 5 to 7 μm thick.

Figure 4I:
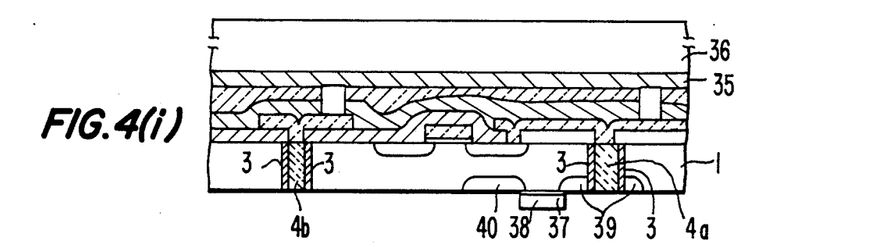

Active elements and other elements are then formed on the second surface of the substrate 1, as shown in FIG. 4(i). All these processes are carried out with the aid of the support plate 36 attached to the substrate 1 since the substrate is too thin and weak to be employed alone during the above-mentioned processes.

During these processes, the temperature of the thermoplastic resin layer 35 of polyoxybenzylene is maintained sufficiently below its deforming temperature of 450° C. so that its adhesive strength does not deteriorate. Therefore, it is preferable to cool the surface of the support plate 36 to avoid an excessive temperature rise in the temperature of the substrate 1 as much as possible. Furthermore, the CVD process, the activation process for forming an impurity ion implanted region, etc., are carried out by irradiating a laser beam having a pulse repetition of a short duration.

A $SiO_2$ layer is grown by a CVD method using monosilane ($SiH_4$) and an oxygen gas mixture at a reduced pressure of 100 Torr, during which the second (bottom) surface of substrate 1 is heated approximately 400° to 500° C. by irradiating the second substrate surface with laser beams. Then a field oxide layer (not shown in the figure) is formed on the second surface, and the field oxide layer is removed to again form an active region and a gate oxide film 37 of $SiO_2$ on the surface. An N+-type polysilicon layer 38 is grown on the gate oxide film 37 by a CVD method using a monosilane ($SiH_4$) and phosphine ($PH_3$) gas mixture at a reduced pressure of 100 Torr by raising the second substrate surface temperature approximately 600° to 650° C. by irradiating the second substrate surface with laser beams. The second surface is patterned using a conventional lithography method to form the gate oxide film 37 and the second gate electrode 38. Arsenic (As) ions are then selectively implanted and the ion implanted regions are laser annealed at a temperature of approximately 850° to 900° C. Thus, an n+-type source region 39 and a drain region 40 are formed. Other elements are also formed in this step, but the details thereof are omitted.

Figure 4J:
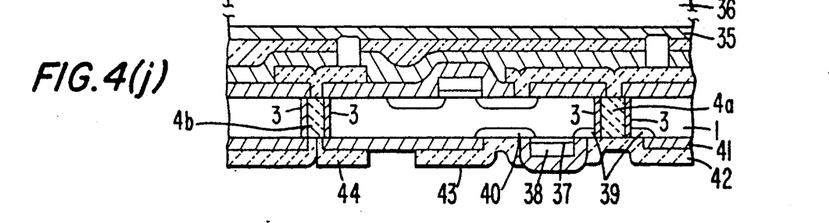

In FIG. 4(j), a 5000 Å thick silicon layer 41 is formed by the same method as that employed in FIG. 4(i). Contact holes are then formed in the silicon layer 41 over areas corresponding to the source region 39 including a bottom end portion of the conducting post 4a, the drain region 10, and the bottom end portion of the conducting post 4b. The n+-type polysilicon layer is deposited and patterned in the same way as the wirings 27 and 28 formed on the first substrate. Thus, a source wiring 42 contacting both the source region 39 and the conducting post 4a, a drain wiring 43 contacting the drain region 40, and a wiring 44 contacting the conducting post 4b are formed.

Figure 4K:
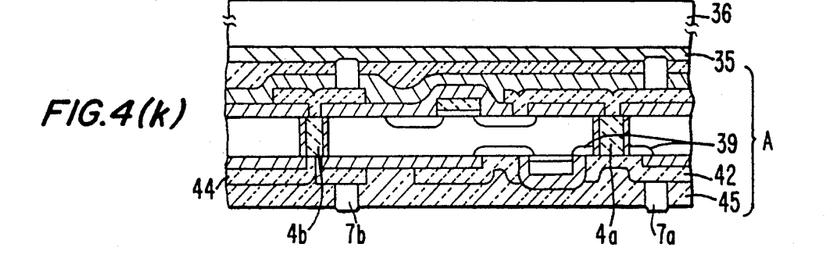

Next, a second cover insulating layer 45 formed of PMSS and having a 1 μm thickness is formed by a spin coating method on the entire second (bottom) surface of the substrate 1, as shown in FIG. 4(k). The second cover insulating layer 45 is dried for solvent evaporation at a temperature of 100° C. Thereafter, applying the same processes as set forth above for forming the interconnection terminals 6a and 6b, an interconnection terminal 7a of an aluminum material is formed contacting the second source wiring 42. In addition, an interconnection terminal 7b is formed contacting the wiring 44.

The substrate is then subjected to a laser scribing of the second (bottom) surface, whereby the substrate is scribed into the thermoplastic resin layer 35, and thus the wafer processes for a unit IC A are finished.

A unit IC having a different design or construction is separately fabricated in the same way. In the case where the unit IC A is used as a top unit of a stacked three-dimensional IC, the formation of the outer insulating layer 29b and interconnection terminals 6 (6a, 6b) are not necessary, and therefore they are omitted.

After the wafer processes are completed, each chip is tested electrically, sorted out and marked as a reject if appropriate, using the interconnection terminals 7 (7a, 7b) as test terminals.

Figure 4L:
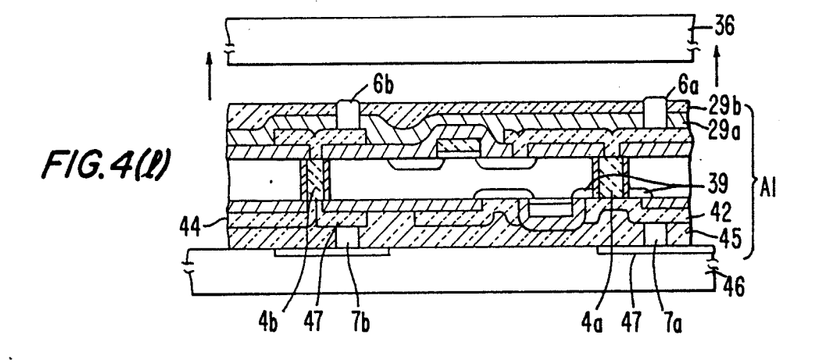

In stacking plural unit ICs and forming a single stacked large three-dimensional IC, unit ICs $A_1$, $A_2$, etc., are stacked one by one. First, as shown in FIG. 4(l), the base plate 46, on which wirings are formed, is heated to a temperature of approximately 350° to 400° C. A single chip of unit ICs $A_1$ formed on a wafer and fixed to the support plate 36 is selected and heated to the same temperature. The unit IC $A_1$ is then compressed onto the base plate 46 such that each interconnection terminal 7 (7a, 7b) coincides with a proper respective position of the wiring 47 on the base plate 46, and is bonded by thermal compression. The second cover insulating layer 45 of PMSS covering the second surface of the unit IC $A_1$ becomes a fluid state at 350° to 400° C. and thereafter hardens and is cured. Consequently, the unit IC $A_1$ is firmly fixed to the base plate 46.

During the above process, it is preferable to cool the opposite (first) surface of the substrate 1 to avoid a change in quality of the thermoplastic resin layer 35.

After the substrate is fixed to the base plate 46, the outside surface of the support plate 36 of the unit IC $A_1$ is heated above a temperature of 450° C. by irradiation with a lamp or laser. This process causes a softening of the thermoplastic resin layer 35, and the unit IC $A_1$ is separated from the support plate 36 since the wafer forming the unit IC $A_1$ is laser scribed around each chip periphery to a depth reaching to the layer 35. The partly remaining thermoplastic resin layer 35 on the surface of the unit IC is then removed by an oxygen gas plasma etching.

Next, another unit IC $A_2$ is stacked on the above-described unit IC $A_1$, as shown in FIG. 3. The unit IC $A_2$ has a different design and is separately fabricated and fixed to another support plate 36. If the same unit IC $A_1$ is stacked on the above-described unit IC $A_1$, another chip of the unit IC $A_1$ formed on the same wafer as above-mentioned can be utilized.

The unit IC $A_2$ is placed and compressed onto the unit IC $A_1$ in an atmosphere at a temperature of approximately 350° to 400° C, whereby interconnection terminals 7a and 7b of the units IC $A_2$ are precisely aligned with the interconnection terminals 6 (6a, 6b) of the unit IC $A_1$. By compressing the second cover insulating layer 45 of the unit IC $A_2$ onto the outer insulating layer 29b of the unit IC $A_1$ at an elevated temperature, softening and subsequent curing of the PMSS layer 45 occurs. Thus, the IC unit $A_2$ is stacked and firmly fixed to the unit IC $A_1$.

In FIG. 3, the PMSS layer 29b and the interconnection terminals 6 (6a, 6b) for the unit IC $A_2$ are not provided because it is used as a top unit IC. Therefore, the thermoplastic resin layer 35 for the unit IC $A_2$ (not shown) is directly coated onto the first insulating layer 29a of the unit IC $A_2$ and glued to the support plate 36.

During the above stacking process of two unit ICs, the first surface of the unit IC $A_2$ is cooled so as to avoid softening of the thermoplastic resin layer 35. The support plate 36 (not shown) for the unit IC $A_2$ is then removed as mentioned above.

Figure 9A:
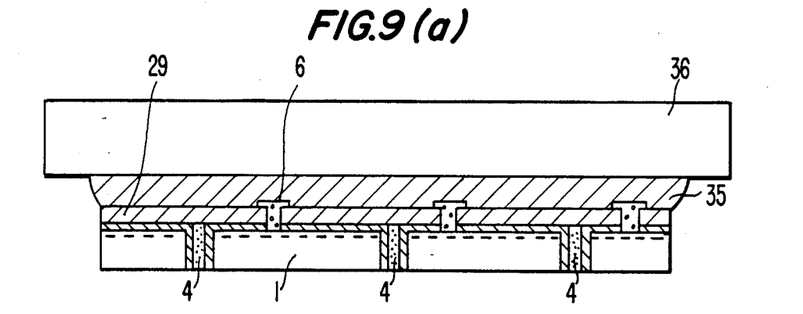
FIGS. 9(a) and 9(b) are cross-sectional views of a stacked the present invention.
Figure 9B:
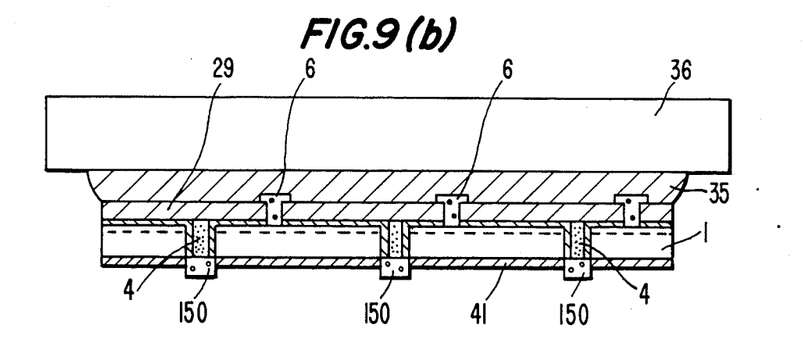

FIG. 9(a) and 9(b) are another cross-sectional views of the device according to the present invention where only the first surface is utilized to form a constituent IC as in FIG. 2(a). The same reference numerals in the figures designate the same or like parts. The device shown in FIG. 9(a) is formed in the same way as explained in FIG. 4(h).

Next as shown in FIG. 9(a), a 5000 Å thick silicon oxide or silicon nitride layer 41 is formed on the second surface of the substrate 1 by a CVD method using a gas mixture of monosilane and oxygen at a reduced pressure of 100 Torr. Contact holes are formed at portions corresponding to bottom portions of the conducting posts 4. Then the aluminum pads 150 are buried in the contact holes contacting with conduction posts 4. Subsequent processes of stacking another unit IC are almost the same as explained in FIG. 4(l).

When the conducting posts 4 (4a, 4b) are fine, the position of the contact window 55 in FIG. 4(d) is apt to deviate from that of the conducting posts 4, and consequently the wiring layers 27 and 28 form a short circuit with the substrate 1. To avoid such a short circuit, an indentation is formed on the surface of substrate 1 surrounding the end portion of the conducting posts 4 and PMSS is filled therein. The details are explained below with reference to FIGS. 5(a) through 5(c).

Figure 5A:
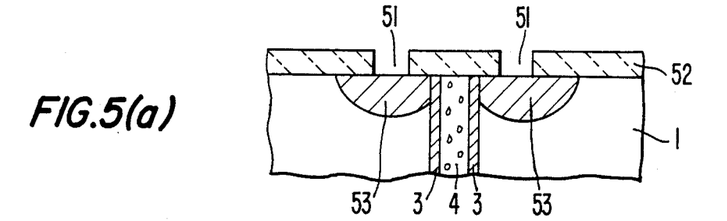
FIGS. 5(a) through 5(c) are partial cross-sectional views wiring on a conducting post according to another embodiment of the present invention.

In FIG. 5(a), a resist layer 52 is formed on the substrate 1 and is patterned such that a ring-shaped region 51 surrounding the top end portion of the conducting post 4 is exposed. The substrate 1 is subjected to a wet etching process forming an indentation 53 surrounding the conducting post 4 and silicon oxide layer 3. The indentation 53 has a width of 2 μm and a depth of 1 μm.

Figure 5B:
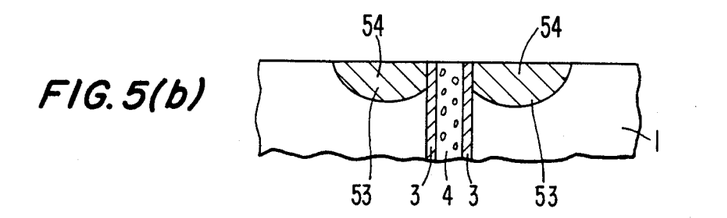

The resist layer 52 is removed and an insulating material 54 such as PMSS fills the indentation 53 by a spin coating method, as shown in FIG. 5(b).

Figure 5C:
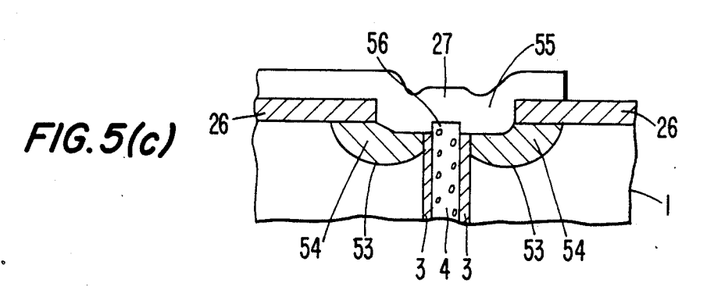

An insulating layer 26 of silicon oxide is formed on the substrate and a contact window 55 is formed therein. A polysilicon wiring 27 is formed in the contact window 55 and on the insulating layer 26, as shown in FIG. 5(c).

According to the above-described method, a wide region of the substrate surface around the conducting posts is exposed by the formation of the contact window in the insulating layer 26. The wiring 27, however, is insulated from the substrate 1 by the insulating mterial 54 formed in the indentation 53. Therefore, a short circuit between the wiring 27 and the substrate 1 is avoided.

Furthermore, when the etching process for the contact window 51 is carried out in excess, a top portion of the conducting post 54 extends into the wiring layer 27. This improves the contact quality between the conducting post 4 and the wiring 27.

The above-described method can also be applied to the second surface of the substrate in a similar manner.

Figure 6A:
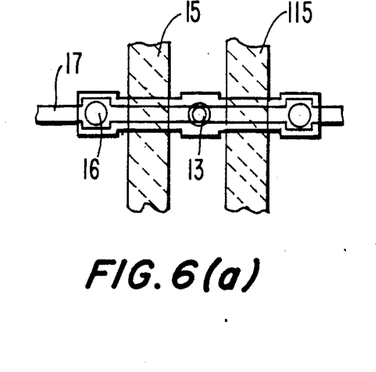
FIGS. 6(a) and 6(b) are a plan view and a cross-sectional view, respectively, of a PROM structure according to another embodiment of the present invention.
Figure 6B:
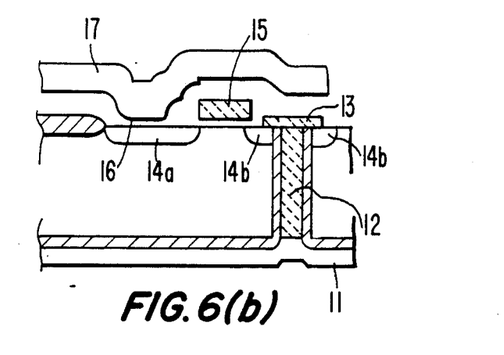

The present invention may be applied to the manufacture of a PROM (programmable read only memory), wherein digital information is recorded by an electrical breakdown of the insulating layer. FIGS. 6(a) and 6(b) are a plan view and a cross-sectional view, respectively, of a single memory cell region of a PROM.

During programming, a bit line 17 is driven to a high voltage so as to break down against the active region 14a of an FET, which is driven by a gate electrode connected to a word line 15. Then a cell element 16, including a thin insulating film or a polysilicon film having a thickness of 100 Å, becomes conductive because of the breakdown therebetween. When the polysilicon film is used, heat is generated during the programming procedure due to the electric current flowing therein. Impurities are diffused into the polysilicon layer and a conductivity thereof is increased.

The pulse current necessary for programming is controlled and limited by a resistance connected to the power source. In the prior art, wiring to the power source is formed on the same surface of the substrate on which active elements are formed, and is formed at the same time source/drain regions 14a and 14b are formed. Therefore, the high resistance of the wiring to the power source restricts the amount of pulse current. To solve this problem, a supplementary wiring of a metal layer is needed to reduce the wiring resistance to the power source. However, this method cannot satisfy the most suitable layout condition of a device design and therefore, the integration density of the device is reduced.

As shown in FIG. 6(b), a wiring 11 is formed on the second surface of the substrate, and a conducting post 12 is connected thereto. Therefore, it is very easy to obtain a low resistance wiring to the power source. Thus, the integration density of the ROM is increased, programming is easily and accurately performed, and the reliability of the device is increased.

Figure 7A:
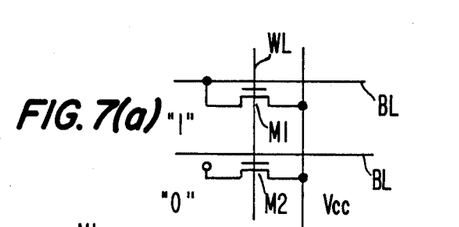
FIG. 7(a) is a circuit diagram of a MASK ROM according to yet another embodiment of the present invention.
Figure 7B:
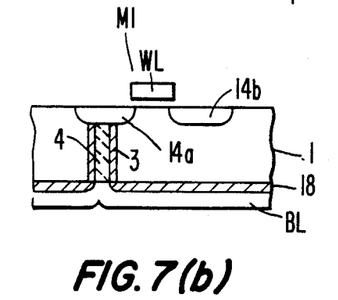
FIGS. 7(b) and 7(c) are partial cross-sectional views of a structure of the MASK ROM in FIG. 7(a)
Figure 7C:
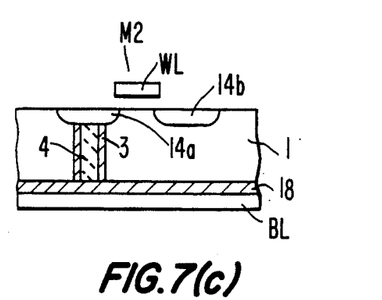

Another embodiment of the present invention is directed to a MASK ROM, which is disclosed in FIGS. 7(a) through 7(c). FIG. 7(a) is a circuit diagram of memory cells in a MASK ROM, FIG. 7(b) is a cross-sectional view of the substrate of the memory cells in FIG. 7(a) having a logic "1" and FIG. 7(c) is a cross-sectional view of the substrate of the memory cell in FIG. 7(a) having a logic "0".

In FIG. 7(a), BL denotes a bit line and WL denotes a word line. $M_1$ and $M_2$ are memory cell transistors. The source/drain region of $M_1$ is connected to the bit line and the source/drain region of $M_2$ is not connected thereto. Therefore, the condition of $M_1$ represents the logic "1" and $M_2$ represents the logic "0".

In FIG. 7(b), the source/drain 14a of transistor $M_1$ is connected to the conducting post 4 which is insulated from the substrate 1 by an insulating film 3. The conducting post 4 is connected to the bit line BL formed on the second surface of the substrate 1 and is insulated therefrom by an insulating layer 18.

In contrast, in FIG. 7(c) the second surface of the conducting post 4 is covered with the insulating layer 18. Therefore, the source/drain 14a is not connected to the bit line BL.

According to the present invention, a memory pattern of a MASK ROM is subject to a mask pattern used in a process of making contact holes for the insulating layer 18. Because this mask pattern is applied to the second surface of the substrate 1, the first surface of the substrate 1 can be separately processed. Hence, active elements such as transistors and other elements can be formed thereon beforehand. This effectively shortens the production time, after receiving logic information, of the MASK ROM.

In the first embodiment of the present invention set forth in FIG. 3, the conducting posts 4 are formed before forming the active elements and other elements on the first surface of the substrate 1 (FIGS. 4(a)–4(l)). However, the conducting posts 4 can be formed after the fabrication of the active elements and other elements. The processes are explained below with reference to FIGS. 8(a) to 8(c).

Figure 8A:
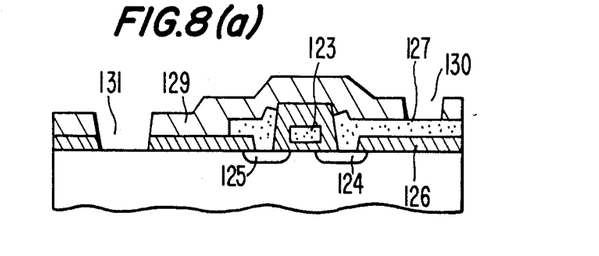
FIGS. 8(a) through 8(c) are cross-sectional views of successive steps of a method for forming a conducting post according to another embodiment of the present invention.

In FIG. 8(a), a MOS FET is formed having a gate electrode 123, a source region 124, and a drain region 125. An $SiO_2$ layer 126 is formed on portions of the substrate. A wiring layer 127 is formed on the $SiO_2$ layer 126 and the source/drain regions 124 and 125. A passivation layer 129, such as a PSG layer, covers the entire surface of the device. Contact holes 130 and 131 are formed therein by a conventional lithography method. Contact hole 131 is formed on the area where subsequently the conducting post will be formed.

Figure 8B:
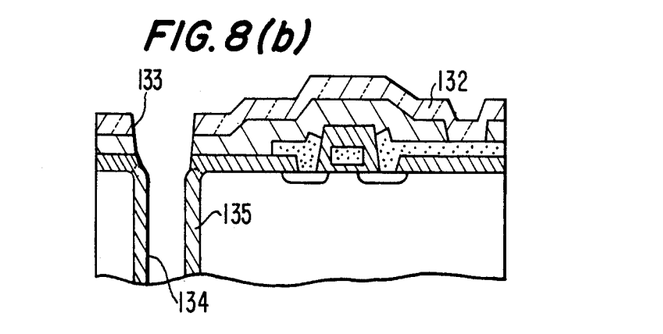

Next, as shown in FIG. 8(b) a resist layer 132 is coated on the entire surface of the device, and a hole 133 is formed therein aligned with the contact hole 131. The substrate is then subjected to a reactive ion etching or a laser wet etching method, resulting in forming a hole 134 which penetrates the substrate. The inside of the hole is then oxidized to form a $SiO_2$ layer 135 and the resist layer 132 is removed.

Figure 8C:
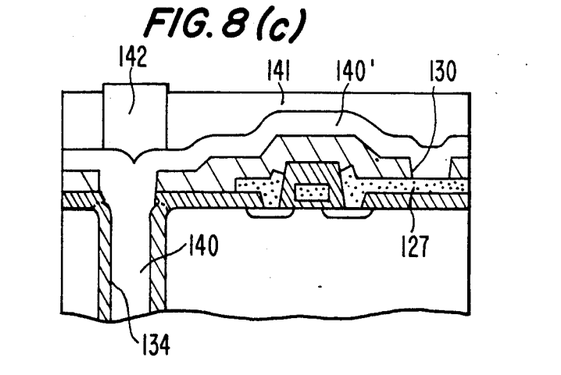

In FIG. 8(c), a conducting material 140, such as polysilicon or metal, is grown filling the hole 134. A surface layer 140' formed of the conducting material 140 is patterned to form a wiring layer which contacts the lower wiring 127 through the contact hole 130. Insulating layer 141, such as a PMSS layer, is coated on the surface of the conducting material 140. An interconnection terminal 142 is formed on the conducting material 140 in the same manner as explained with respect to the first embodiment and is located over the hole 134.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalents of the claims are, therefore, to be embraced therein.

What is claimed is:

1. A semiconductor integrated circuit comprising:
a plurality of unit semiconductor integrated circuits stacked together, each of said unit semiconductor integrated circuits comprising:
a substrate having first and second surfaces, said second surface having a smooth mirror finish;

an integrated circuit including at least one of an active and passive functional element, formed on at least said first surface of said substrate;

a conducting post having first and second end portions, said conducting post penetrating through said substrate to said first and second surfaces, and insulated therefrom; and a wiring, formed on said first and second surfaces of said substrate including said conducting post and said integrated circuit, being selectively connected to said integrated circuit and to said first and second end portions of said conducting post;

an insulating layer, formed on the surface of said unit semiconductor integrated circuits, for connecting two adjacent ones of said plurality of unit semiconductor integrated circuits; and an interconnection terminal, formed in said insulating layer and extending to said wiring, for connecting said two adjacent ones of said plurality of unit semiconductor integrated circuits.

2. A semiconductor integrated circuit according to claim 1, wherein said integrated circuit is formed on said first and second surfaces of said substrate.

3. A semiconductor integrated circuit according to claim 1, wherein an indentation is formed in said substrate, surrounding one of the first and second end portions of said conducting post, wherein said insulating layer is formed in said indentation, and wherein said wiring is formed on said buried insulating layer and said one of the first and second end portions of said conducting post.

4. A semiconductor integrated circuit according to claim 1, wherein said insulating layer is formed of thermosetting resin.

5. A semiconductor integrated circuit according to claim 4, wherein said thermosetting resin is silylated polymethylsilsesquioxane (PMSS).

6. A semiconductor integrated circuit comprising:
a substrate having first and second surfaces, said second surface having a smooth mirror finish;
a field effect transistor (FET) formed on said first surface of said substrate, said FET having a source region, a drain region and a gate region;
a conducting post, having first and second end portions penetrating through said substrate to said first and second surfaces and insulated therefrom, said first end portion being selectively connected to one of said drain region and source region of said FET; and
a wiring formed on said second surface of said substrate and said conducting post and selectively connected to said second end portion of said conducting post.

7. A semiconductor integrated circuit according to claim 6, wherein said semiconductor integrated circuit is a PROM structure including a bit line, wherein a region of said FET not connected to said conducting post forms a memory cell, and wherein said wiring forms a power source wiring.

8. A semiconductor integrated circuit according to claim 6, wherein said semiconductor integrated circuit is a MASK ROM structure, wherein a region of said FET not connected to said conducting post is connected to a power source, and wherein said wiring forms a bit line of said MASK ROM, whereby bit information is written in dependence upon whether said bit line is connected to said conducting post.

9. A semiconductor integrated circuit according to claim 6, wherein an indentation is formed in said substrate, surrounding said second end portion of said conducting post, wherein an insulating layer is formed in said indentation, and wherein said wiring is formed on said buried insulating layer and selectively connected to said second end portion of said conducting post.

10. A semiconductor integrated circuit comprising:
a substrate having first and second surfaces, said second surface having a smooth mirror finish;
a first integrated circuit formed on said first surface of said substrate, said first integrated circuit including at least one of an active and passive functional element;
a second integrated circuit formed on said second surface of said substrate, said second integrated circuit including at least one of an active and passive functional element;
conducting posts, having first and second end portions and placed in through holes extending from said first surface to said second surface of said substrate and insulated from said substrate;
an insulating film formed inside the through holes in said substrate;
first and second insulating layers formed on said first and second surface of said substrate, respectively, through holes formed in portions therein located over said conducting posts;
first and second wiring layers formed on said first and second insulating layers, respectively, and said conducting posts;
first and second cover insulating layers formed on said first and second wiring and insulating layers, respectively, through holes being formed in portions therein; and
interconnection terminals, selectively formed in the through holes of said first and second cover insulating layers, one end of said interconnection terminals being connected to said respective wiring layers.

11. A semiconductor device according to claim 10, wherein said first and second cover insulating layers include an inner insulating layer and an outer insulating layer formed on said inner insulating layer.

12. A semiconductor integrated circuit according to claim 11, wherein said first and second insulating layers are formed of thermosetting silicon resin.

13. A semiconductor integrated circuit, comprising:
a plurality of unit semiconductor integrated circuits stacked together, each of said unit semiconductor integrated circuits, comprising:
a substrate having a first and second surfaces, said second surface having a smooth mirror finish;
an integrated circuit including at least one of an active and passive functional element formed at least on said first surface of said substrate;
a conducting post having first and second end portions, said conducting post placed in a through hole extending from said first surface to said second surface of said substrate and insulated from said substrate; and
a wiring formed on said first and second surfaces of said substrate, said conducting post, and said integrated circuit, being selectively connected to said integrated circuit and to the first and second end portions of said conducting post;
an insulating layer, formed on said unit semiconductor integrated circuits, for connecting adjacent ones of said plurality of unit semiconductor integrated circuits; and an interconnection terminal formed in said insulating layer and extending to and contacting said wiring formed on said first and second surfaces, for connecting said two adjacent ones of said plurality of unit semiconductor integrated circuits.

14. A semiconductor integrated circuit comprising:

a plurality of unit semiconductor integrated circuits stacked together, each of said unit semiconductor integrated circuits comprising:

a substrate having first and second surfaces, said second surfaces having a smooth mirror finish;

an integrated circuit including at least one of an active and passive functional element, formed on at least said first surface of said substrate;

a conducting post having first and second end portions, penetrating through said substrate, and insulated therefrom; and a wiring, formed on said first and second surfaces of said substrate and said integrated circuit, being selectively connected to said integrated circuit and to said first and second end portions of said conducting post;

an insulating layer, including at least a thermosetting resin layer, formed on an outermost surface of said unit semiconductor integrated circuits and having a flat surface, for connecting adjacent ones of said plurality of unit semiconductor integrated circuits; and an interconnection terminal, formed in said insulating layer and penetrating through said thermosetting layer and extending to said wiring, for connecting said two adjacent ones of said plurality of unit semiconductor integrated circuits.

15. A semiconductor integrated circuit according to claim 14, wherein said thermosetting resin is silylated polymethylsilsesquioxane (PMSS).

* * * * *

UNITED STATES PATENT AND TRADEMARK OFFICE
CERTIFICATE OF CORRECTION

PATENT NO. : 4,939,568

DATED : JULY 3, 1990

INVENTOR(S) : TAKASHI KATO ET AL.

It is certified that error appears in the above-identified patent and that said Letters Patent is hereby corrected as shown below:

TITLE PAGE: [56] line 3, "3,787,252  0/0000" should be --3,787,252  1/1974  Filippazzi et al..........148/175--.

Col. 3, line 29, "views wiring" should be --views of an improved method for forming a contacting portion of a wiring--;

line 44, "stacked the" should be --stacked three-dimensional IC according to still another embodiment of the--.

Col. 6, line 43, "An N$^+$-type" should be --An n$^+$-type--;

line 63, "region 10," should be --region 40,--.

Signed and Sealed this

Seventeenth Day of December, 1991

Attest:

HARRY F. MANBECK, JR.

Attesting Officer          Commissioner of Patents and Trademarks